United States Patent
Choi

(10) Patent No.: US 9,614,182 B2
(45) Date of Patent: Apr. 4, 2017

(54) METHOD OF MANUFACTURING DISPLAY APPARATUS THAT INCLUDES USING AN ENERGY BEAM TO FORM AN ENCAPSULATION LAYER

(71) Applicant: SAMSUNG DISPLAY CO., LTD., Yongin, Gyeonggi-Do (KR)

(72) Inventor: Jai-Hyuk Choi, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 137 days.

(21) Appl. No.: 14/531,302

(22) Filed: Nov. 3, 2014

(65) Prior Publication Data
US 2015/0364719 A1 Dec. 17, 2015

(30) Foreign Application Priority Data

Jun. 13, 2014 (KR) .................. 10-2014-0072301

(51) Int. Cl.
*H01L 51/52* (2006.01)
*C23C 16/48* (2006.01)
*C23C 14/22* (2006.01)

(52) U.S. Cl.
CPC .......... *H01L 51/5253* (2013.01); *C23C 14/22* (2013.01); *H01L 2251/306* (2013.01)

(58) Field of Classification Search
CPC ..................... H01L 51/5253; C23C 14/22
See application file for complete search history.

(56) References Cited

U.S. PATENT DOCUMENTS

| | | | |
|---|---|---|---|
| 8,304,990 B2 | 11/2012 | Aitken et al. | |
| 8,435,604 B2 | 5/2013 | Aitken et al. | |
| 2008/0290798 A1 | 11/2008 | Quesada | |
| 2013/0230665 A1* | 9/2013 | Park | H01L 51/5253 427/535 |

FOREIGN PATENT DOCUMENTS

| KR | 2010-0029774 A | 3/2010 |
|---|---|---|
| KR | 2008-0045217 A | 5/2010 |
| KR | 2010-0050470 A | 5/2010 |

* cited by examiner

*Primary Examiner* — Joseph L Williams
(74) *Attorney, Agent, or Firm* — Lee & Morse, P.C.

(57) ABSTRACT

A method of manufacturing a display apparatus, the method including forming a display device on a substrate; and forming a thin-film encapsulation layer on the display device, the thin-film encapsulation layer including at least one inorganic layer that includes low-temperature viscosity transition (LVT) inorganic materials, wherein forming the thin-film encapsulation layer includes irradiating energy beams toward the thin-film encapsulation layer during formation of the thin-film encapsulation layer.

19 Claims, 9 Drawing Sheets

METHOD OF MANUFACTURING DISPLAY APPARATUS THAT INCLUDES USING AN ENERGY BEAM TO FORM AN ENCAPSULATION LAYER

CROSS-REFERENCE TO RELATED APPLICATION

Korean Patent Application No. 10-2014-0072301, filed on Jun. 13, 2014, in the Korean Intellectual Property Office, and entitled: "Method of Manufacturing Display Apparatus," is incorporated by reference herein in its entirety.

BACKGROUND

1. Field

Embodiments relate to a method of manufacturing a display apparatus.

2. Description of the Related Art

Recently, display apparatuses have been variously used. For example, as display apparatuses have become thin and light, a usage range thereof tends to be widened. Among the display apparatuses, a display apparatus may include a self-emission display apparatus that consumes a small amount of power and has good view of angles and definition.

The display apparatus may include a display device that produces an image towards a user, that is arranged between a first electrode and a second electrode, and that includes an organic light-emitting device including at least one emission layer.

SUMMARY

Embodiments are directed to a method of manufacturing a display apparatus.

The embodiments may be realized by providing a method of manufacturing a display apparatus, the method including forming a display device on a substrate; and forming a thin-film encapsulation layer on the display device, the thin-film encapsulation layer including at least one inorganic layer that includes a low-temperature viscosity transition (LVT) inorganic material, wherein forming the thin-film encapsulation layer includes irradiating an energy beam toward the thin-film encapsulation layer during formation of the thin-film encapsulation layer.

Forming the thin-film encapsulation layer may include providing a source material of the thin-film encapsulation layer to the display device.

Irradiating the energy beam may be simultaneously performed with the providing the source material of the thin-film encapsulation layer to the display device.

Irradiating the energy beam may include irradiating an energy beam at one or more points of time that overlap a process time for providing the source material of the thin-film encapsulation layer to the display device.

Irradiating the energy beam may be performed right after providing the source material of the thin-film encapsulation layer to the display device.

Providing the source material of the thin-film encapsulation layer to the display device may include performing a deposition process.

Providing the source material of the thin-film encapsulation layer to the display device may include performing at least one selected from the group of evaporation, electron beam deposition, laser deposition, thermal deposition, a spraying method, and a sputtering method.

Providing the source material of the thin-film encapsulation layer to the display device may include performing co-deposition using the source material of the thin-film encapsulation layer.

Providing the source material of the thin-film encapsulation layer to the display device may include providing the source material to the display device in a direction that is at an oblique angle relative to a direction to which the energy beam is irradiated to the display device.

The energy beam may include at least one selected from the group of ion beams, electron beams, laser beams, and neutron beams.

Irradiating the energy beam may include periodically irradiating the energy beam a plurality of times.

Irradiating the energy beam may include irregularly irradiating the energy beam a plurality of times.

Irradiating the energy beam may include ionizing inert gases to provide the energy beam.

Forming the thin-film encapsulation layer may include cooling the substrate with a cooling member.

Forming the thin-film encapsulation layer may include injecting a peripheral gas around the substrate.

The peripheral gas may include oxygen, nitrogen, or an oxynitride gas.

A viscosity transition temperature of the LVT inorganic material may be a minimum temperature at which fluidity is provided to the LVT inorganic material.

The LVT inorganic material may include tin oxide.

The LVT inorganic material may further include one or more of phosphorus oxide, boron phosphate, tin fluoride, niobium oxide, tungsten oxide, aluminum, carbon, ZnO, $B_2O_3$, and BiO.

The LVT inorganic material may include SnO; SnO and $P_2O_5$; SnO and $BPO_4$; SnO, $SnF_2$, and $P_2O_5$; SnO, $SnF_2$, $P_2O_5$, and NbO; or SnO, $SnF_2$, $P_2O_5$, and $WO_3$.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
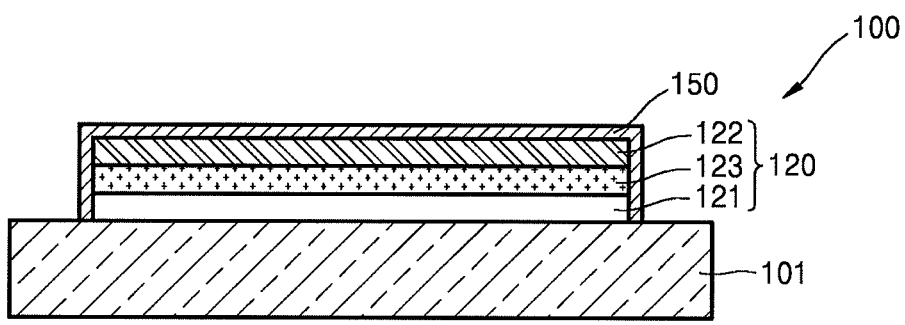
FIG. 1 illustrates a schematic cross-sectional view of a display apparatus manufactured by a method according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a", "an", and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. For example, intervening layers, regions, or components may be present.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

FIG. 1 illustrates a schematic cross-sectional view of a display apparatus 100 manufactured by a method according to an embodiment.

The display apparatus 100 may include a substrate 101, a display device 120, and a thin-film encapsulation layer 150. The thin-film encapsulation layer 150 may include at least one inorganic layer having low temperature viscosity transition (LVT) inorganic materials.

The substrate 101 may be formed of various materials. For example, the substrate 101 may be formed of transparent glass materials that mainly include silicon dioxide ($SiO_2$). In an implementation, the substrate 101 may be formed of a flexible material, e.g., a plastic material.

The display device 120 may have diverse shapes. The display device 120 may be, e.g., an organic light-emitting device or a liquid crystal device (LCD). In an implementation, the display device 120 may include various types of devices capable of emitting visible rays towards a user.

A case where the display device 120 is an organic light-emitting device is described with reference to FIG. 1. In this case, the display device 120 may include a first electrode 121, a second electrode 122, and an intermediate layer 123.

For example, the first electrode 121 may be formed on the substrate 101, and the second electrode 122 may be formed on the first electrode 121. The intermediate layer 123 may be formed between the first and second electrodes 121 and 122.

Although not illustrated, a buffer layer (not shown) may be further formed between the first electrode 121 and the substrate 101. The buffer layer may provide a planarization layer on the substrate 101 and may help prevent moisture or gas from penetrating into the substrate 101.

In an implementation, a barrier layer, which may be formed as a single layer or layers that have substantially the same materials as the buffer layer, may be formed between the substrate 101 and the buffer layer. For example, when the substrate 101 is formed of a plastic material, the barrier layer may be formed on the substrate 101 and may effectively help prevent moisture from penetrating into the substrate 101.

The first electrode 121 may function as an anode, and the second electrode 122 may function as a cathode. In an implementation, polarities of the first and second electrodes 121 and 122 may be changed.

When the first electrode 121 functions as an anode, the first electrode 121 may include, e.g., indium tin oxide (ITO), indium zinc oxide (IZO), zinc oxide (ZnO), indium oxide ($In_2O_3$), or the like, materials that have high work functions. In an implementation, the first electrode 121 may further include a reflective film formed of, e.g., silver (Ag), magnesium (Mg), aluminum (Al), platinum (Pt), palladium (Pd), gold (Au), nickel (Ni), neodymium (Nd), iridium (Ir), chromium (Cr), lithium (Li), ytterbium (Yb), calcium (Ca), or the like, according to a purpose of using the first electrode 121 and design conditions.

When the second electrode 122 functions as a cathode, the second electrode 122 may be formed of metals, e.g., Ag, Mg, Al, Pt, Pd, Au, Ni, Nd, Ir, Cr, Li, or Ca. In an implementation, the second electrode 122 may include, e.g., ITO, IZO, ZnO, $In_2O_3$, or the like, for light penetration.

The intermediate layer 123 may include an organic emission layer. In an implementation, the intermediate layer 123 may include the organic emission layer and may selectively include at least one of a hole injection layer, a hole transport layer, an electron transport layer, and an electron injection layer.

When a voltage is applied to the first electrode 121 and the second electrode 122, the intermediate layer 123, e.g., the organic emission layer of the intermediate layer 123, may emit visible rays.

Although not illustrated, the display apparatus 100 may include one or more thin-film transistors (TFT) (not shown) that are electrically connected to the display device 120.

The display apparatus 100 may include one or more capacitors that are electrically connected to the display device 120.

Although not illustrated, one or more capping layers (not shown) may be formed between the display device 120 and the thin-film encapsulation layer 150. The capping layers (not shown) may help protect the display device 120, e.g., the second electrode 122 that is a topmost layer of the display device 120. In an implementation, when the capping layers are formed to control a refractive index of light emitted from the intermediate layer 123 so that light emitted from the display device 200 is emitted towards the second electrode 122, light efficiency may be improved. As a selective example, a refractive index of the capping layers may be greater than that of a layer under the capping layers, e.g., the second electrode 122.

In an implementation, a planarization layer (not shown) or a protection layer (not shown) may be formed between the display device 120 and the thin-film encapsulation layer 150. The planarization layer or the protection layer may provide a flat surface on the display device 120 and may primarily help protect the display device 120. The planarization layer or the protection layer may be formed of a variety of suitable insulating materials, e.g., organic materials.

The thin-film encapsulation layer 150 may be formed on the display device 120.

The thin-film encapsulation layer 150 may include at least one inorganic layer including LVT inorganic materials.

Throughout the specification, the term "viscosity transition temperature" does not mean a temperature at which the LVT inorganic materials change forms thereof from a solid to a liquid, but refers to a minimum temperature at which fluidity is provided to the LVT inorganic materials, e.g., a minimum temperature at which the viscosity of the LVT inorganic materials is changed.

The viscosity transition temperature of the LVT inorganic materials may be less than a denaturation or decomposition temperature of materials included in the display device 120, e.g., materials included in the intermediate layer 123. For example, the viscosity transition temperature of the LVT inorganic materials may be less than a minimum value of the denaturation temperature of the materials included in the intermediate layer 123. The denaturation temperature of the intermediate layer 123 may be a temperature at which the materials included in the intermediate layer 123 are physically and/or chemically denatured or decomposed. There may be only one denaturation temperature or various denaturation temperatures according to types and the number of materials included in the intermediate layer 123.

For example, the viscosity transition temperature of the LVT inorganic materials may be a glass transition temperature of the LVT inorganic materials, and the denaturation temperature of the intermediate layer 123 may be a glass transition temperature of organic materials included in the intermediate layer 123.

The glass transition temperatures of the materials may be measured by performing thermogravimetric analysis (TGA) on the LVT inorganic materials and the organic materials included in the intermediate layer 123. In an implementation, the glass transition temperature may be determined from the results of performing a thermal analysis (under an $N_2$ atmosphere, a temperature range: from ambient temperature to 600° C. (10° C./min)-TGA, from ambient temperature to 400° C., differential scanning calorimetry (DSC), a pan type: Pt pan in disposable Al Pan (TGA), disposable Al pan (DSC)) using TGA, DSC on the materials included in the intermediate layer 123.

The denaturation temperature of the materials included in the intermediate layer 123 may exceed, e.g., 130° C. The denaturation temperature of the materials may be easily measured through the TGA.

A minimum value of the denaturation temperature of the materials included in the intermediate layer 123 may be, e.g., about 130° C. to about 140° C. For example, the minimum value of the denaturation temperature of the materials included in the intermediate layer 123 may be 132° C. The minimum value of the denaturation temperature of the materials included in the intermediate layer 123 may be determined after the denaturation temperatures of the materials included in the intermediate layer 123 are calculated through the TGA and a minimum glass transition temperature is selected.

For example, the viscosity transition temperature of the LVT inorganic materials may be, e.g., about 80° C. to about 132° C. In an implementation, the viscosity transition temperature of the LVT inorganic materials may be, e.g., about 80° C. to about 120° C. or from about 100° C. to about 120° C. In an implementation, the viscosity transition temperature of the LVT inorganic materials may be about 110° C.

The LVT inorganic materials may be formed of a single compound or combinations of two or more compounds.

In an implementation, the LVT inorganic materials may include tin oxide (e.g., SnO, $SnO_2$, or the like). When the LVT inorganic materials include SnO, the content of SnO may range from about 20 weight % to about 100 weight %.

The LVT inorganic materials may further include one of phosphorus oxide (e.g., $P_2O_5$), boron phosphate ($BPO_4$), tin fluoride (e.g., $SnF_2$), niobium oxide (e.g., NbO), tungsten oxide (e.g., $WO_3$), in addition to the tin oxide.

In an implementation, the LVT inorganic materials may include, e.g., SnO, SnO and $P_2O_5$; SnO and $BPO_4$; SnO, $SnF_2$, and $P_2O_5$; SnO, $SnF_2$, $P_2O_5$, and NbO; or SnO, $SnF_2$, $P_2O_5$, and $WO_3$.

In an implementation, the LVT inorganic materials may have, e.g., one of the following compositions:
1) SnO (100 wt %);
2) SnO (80 wt %) and $P_2O_5$ (20 wt %);
3) SnO (90 wt %) and $BPO_4$ (10 wt %);
4) SnO (20-50 wt %), $SnF_2$ (30-60 wt %) and $P_2O_5$ (10-30 wt %) (in which a sum of the weights of SnO, $SnF_2$, and $P_2O_5$ is 100 wt %);
5) SnO (20-50 wt %), $SnF_2$ (30-60 wt %), $P_2O_5$ (10-30 wt %), and NbO (1-5 wt %) (in which a sum of the weights of SnO, $SnF_2$, $P_2O_5$, and NbO is 100 wt %); or
6) SnO (20-50 wt %), $SnF_2$ (30-60 wt %), $P_2O_5$ (10-30 wt %), and $WO_3$ (1-5 wt %) (in which a sum of the weights of SnO, $SnF_2$, $P_2O_5$, and $WO_3$ is 100 wt %).

In an implementation, the LVT inorganic materials may include SnO (42.5 wt %), $SnF_2$ (40 wt %), $P_2O_5$ (15 wt %), and $WO_3$ (2.5 wt %).

In an implementation, the LVT inorganic materials may include Al, C, ZnO, boron trioxide ($B_2O_3$), or BiO in addition to the tin oxide.

When the thin-film encapsulation layer 150, including inorganic layers that includes the inorganic materials having the above-described compositions, is formed, the viscosity transition temperature of the thin-film encapsulation layer 150 may remain lower than the denaturation temperature of the intermediate layer 123. Thus, the thin-film encapsulation layer 150 may be easily formed without damage to the intermediate layer 123.

In an implementation, any defects that may be caused while the thin-film encapsulation layer 150 is formed may be easily corrected.

FIGS. 2A through 2D illustrate diagrams of stages in a method of manufacturing the display apparatus 100, according to an embodiment. For example, FIGS. 2A through 2D sequentially show the method of manufacturing the display apparatus 100 of FIG. 1. However, the method of manufacturing a display apparatus may be applied to various types of display apparatuses besides the display apparatus 100 of FIG. 1.

Figure 2A:
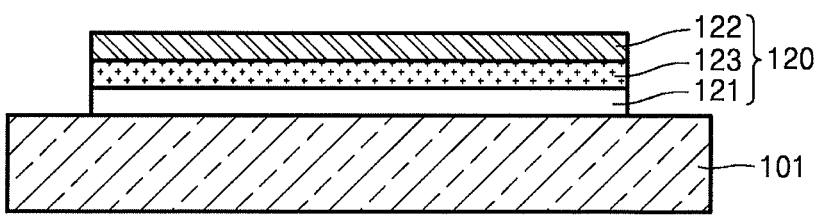
FIGS. 2A through 2D illustrate diagrams of stages in a method of manufacturing a display apparatus, according to an embodiment.

Referring to FIG. 2A, the display device 120 may be formed on the substrate 101. As described in the embodiment of FIG. 1, the display device 120 may have a variety of shapes. When the display device 120 includes an organic light-emitting device, the display device 120 may include the first electrode 121, the second electrode 122, and the intermediate layer 123.

In addition, as described above, the display apparatus 100 may further include a TFT (not shown) and a capacitor (not shown) that are electrically connected to the display device 120.

Figure 2B:
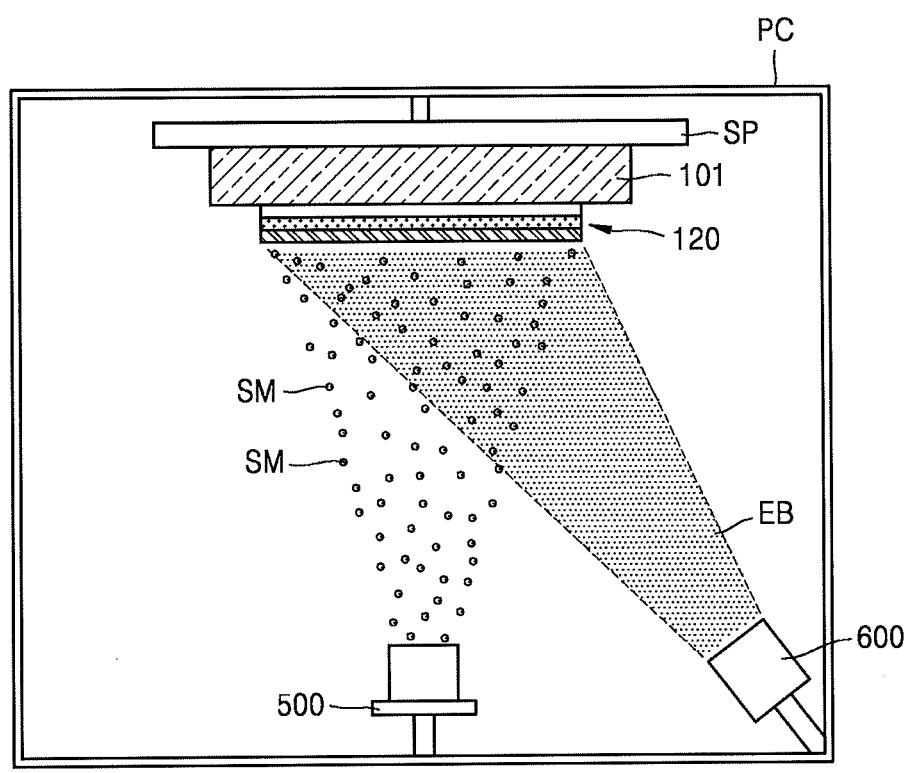

Referring to FIG. 2B, the thin-film encapsulation layer 150 may be formed on the display device 120. For example, a process of manufacturing the thin-film encapsulation layer 150 may be performed by using a source material-providing unit 500 and an energy beam irradiating unit 600.

The process of manufacturing the thin-film encapsulation layer 150 may be performed in a process chamber (PC). As shown in FIG. 2A, a structure in which the display device 120 is formed on the substrate 101 may be arranged in the PC. In this regard, a process of forming the thin-film encapsulation layer 150 while the substrate 101 is arranged on a supporter SP may be performed. In an implementation, a fixing member (not shown) may be further included to stably fix the substrate 101 on the supporter SP.

In an implementation, a vacuous, vacuum, or low-pressure atmosphere may be maintained in the PC in order to effectively perform processes to be described below or to help improve features of the thin-film encapsulation layer 150. Thus, a pressure control member, e.g., a pump (not shown), may be connected to the PC.

The source material-providing unit 500 and the energy beam irradiating unit 600 may be arranged in the PC. The source material-providing unit 500 and the energy beam irradiating unit 600 may be arranged to face the display device 120. In an implementation, the substrate 101 may be arranged on the supporter SP in the PC, and the source material-providing unit 500 and the energy beam irradiating unit 600 may be arranged at a bottom, e.g., opposite end, of the PC.

The source material-providing unit 500 may provide one or more source materials SM towards the display device 120.

Types of the source materials SM may vary, and the source materials SM include diverse suitable materials for forming the thin-film encapsulation layer 150.

For example, as described above, the source materials SM may include at least one inorganic layer including LVT inorganic materials.

The LVT inorganic materials may include a single compound or a combination of two or more compounds.

In an implementation, the LVT inorganic materials may include tin oxide (e.g., SnO, $SnO_2$, or the like). When the LVT inorganic materials include SnO, the content of SnO may be from about 20 weight % to about 100 weight %.

The LVT inorganic materials may further include, e.g., at least one of phosphorus oxide (e.g., $P_2O_5$), boron phosphate ($BPO_4$), tin fluoride (e.g., $SnF_2$), niobium oxide (e.g., NbO), tungsten oxide (e.g., $WO_3$), in addition to the tin oxide.

For example, the LVT inorganic materials may include:
SnO;
SnO and $P_2O_5$;
SnO and $BPO_4$;
SnO, $SnF_2$, and $P_2O_5$;
SnO, $SnF_2$, $P_2O_5$, and NbO; or
SnO, $SnF_2$, $P_2O_5$, and $WO_3$.

For example, the LVT inorganic materials may have the following compositions, but the compositions are not limited thereto:
1) SnO (100 wt %);
2) SnO (80 wt %) and $P_2O_5$ (20 wt %);
3) SnO (90 wt %) and $BPO_4$ (10 wt %);
4) SnO (20-50 wt %), $SnF_2$ (30-60 wt %) and $P_2O_5$ (10-30 wt %) (in which a sum of the weights of SnO, $SnF_2$, and $P_2O_5$ is 100 wt %);
5) SnO (20-50 wt %), $SnF_2$ (30-60 wt %), $P_2O_5$ (10-30 wt %), and NbO (1-5 wt %) (in which a sum of the weights of SnO, $SnF_2$, $P_2O_5$, and NbO is 100 wt %); or
6) SnO (20-50 wt %), $SnF_2$ (30-60 wt %), $P_2O_5$ (10-30 wt %), and $WO_3$ (1-5 wt %) (in which a sum of the weights of SnO, $SnF_2$, $P_2O_5$, and $WO_3$ is 100 wt %).

In an implementation, the LVT inorganic materials may include SnO (42.5 wt %), $SnF_2$ (40 wt %), $P_2O_5$ (15 wt %), and $WO_3$ (2.5 wt %).

In an implementation, the LVT inorganic materials may include Al, C, ZnO, $B_2O_3$ or BiO in addition to the tin oxide.

There may be a plurality of processes of providing the source materials SM, and one of the processes may include deposition. Examples of the deposition may include evaporation, electric beam deposition, laser deposition, and thermal deposition. In an implementation, a process of providing the source materials SM may include a spraying method or a sputtering method.

In an implementation, the process of providing the source materials SM may be performed by co-deposition.

The energy beam irradiating unit 600 may irradiate energy beams EB towards the substrate 101, e.g., towards the display device 120. In this case, the energy beam irradiating unit 600 may irradiate the energy beams EB during a process of providing the source materials SM to the display device 120 from the source material-providing unit 500.

The energy beam irradiating unit 600 may irradiate the energy beams EB that are in different forms, e.g., and may include at least one selected from the group of ion beams, electron beams, laser beams, and neutron beams. The energy beams EB may be energy beams EB formed using ionized inert gases. For example, when the energy beams EB use the ion beams, the energy beams EB may use the ionized inert gases.

The energy beams EB irradiated by the energy beam irradiating unit 600 may increase a speed of providing the source materials SM. By increasing the speed of providing the source materials SM, the thin-film encapsulation layer 150 may be quickly formed by using the provided source materials SM.

Moreover, by increasing the speed of providing the source materials SM, the source materials SM may be uniformly and smoothly scattered or distributed on the display device 120 so that the thin-film encapsulation layer 150 may be formed even and dense. A process of effectively scattering the source materials SM may easily remove foreign materials that already exist on the display device 120 and/or may solve or correct for defects that may be generated on the display device 120 due to the source materials SM.

In an implementation, the energy beam irradiating unit 600 may irradiate the energy beams EB once at or during at least one point of time that overlaps a process time when the source materials SM are provided from the source material-providing unit 500 to the display device 120.

In an implementation, the energy beam irradiating unit 600 may irradiate the energy beams EB at points of time that overlap the process time when the source materials SM are provided from the source material-providing unit 500 to the display device 120. For example, the energy beam irradiating unit 600 may periodically irradiate the energy beams EB at some points of time. In an implementation, the energy beam irradiating unit 600 may irregularly irradiate the energy beams EB at some points of time.

The energy beam irradiating unit 600 and the source material-providing unit 500 may be arranged in various forms. In an implementation, as shown in FIG. 2B, the energy beam irradiating unit 600 and the source material-providing unit 500 may be obliquely arranged. For example, a direction in which the source materials SM are provided from the source material-providing unit 500 to the display device 120 and a direction in which the energy beam irradiating unit 600 irradiates the energy beams EB to the display device 120 may not be parallel, but rather may form a certain, e.g., oblique, angle. For example, the direction in which the source materials SM are provided from the source material-providing unit 500 to the display device 120 may be perpendicular to the substrate 101, and the direction in which the energy beam irradiating unit 600 irradiates the energy beams EB to the display device 120 may be acute or obtuse relative to the substrate 101 and/or to the source material-providing unit 500.

By obliquely arranging the source material-providing unit 500 and the energy beam irradiating unit 600, a space within the PC may be efficiently used, and arranging the source material-providing unit 500 and the energy beam irradiating unit 600 may be easy.

In addition, an influence of the energy beams EB of the energy beam irradiating unit 600, which are not materials for forming the thin-film encapsulation layer 150, e.g., that do not directly form the thin-film encapsulation layer 150, on the display device 120 may be minimized.

Also, as described above, the energy beam irradiating unit 600 may include or provide at least one selected from the group of ion beams, electron beams, laser beams, and neutron beams.

In an implementation, the energy beam irradiating unit 600 may use or provide both ion beams and electron beams as the energy beams EB. For example, positive charges or negative charges that may remain in the display device 120 may be neutralized by using the ion beams and the electron beams as the energy beams EB. Thus, the energy beam irradiating unit 600 may irradiate the electron beams right or immediately after irradiating the ion beams, or may irradiate the ion beams right or immediately after irradiating the electron beams. In an implementation, the ion beams and the electron beams may be alternately irradiated several times.

In an implementation, the energy beam irradiating unit 600 may include irradiation members (not shown) to use or provide both ion beams and electron beams as the energy beams EB. One irradiation member may irradiate ion beams and another irradiation member may irradiate electron beams.

Figure 2C:
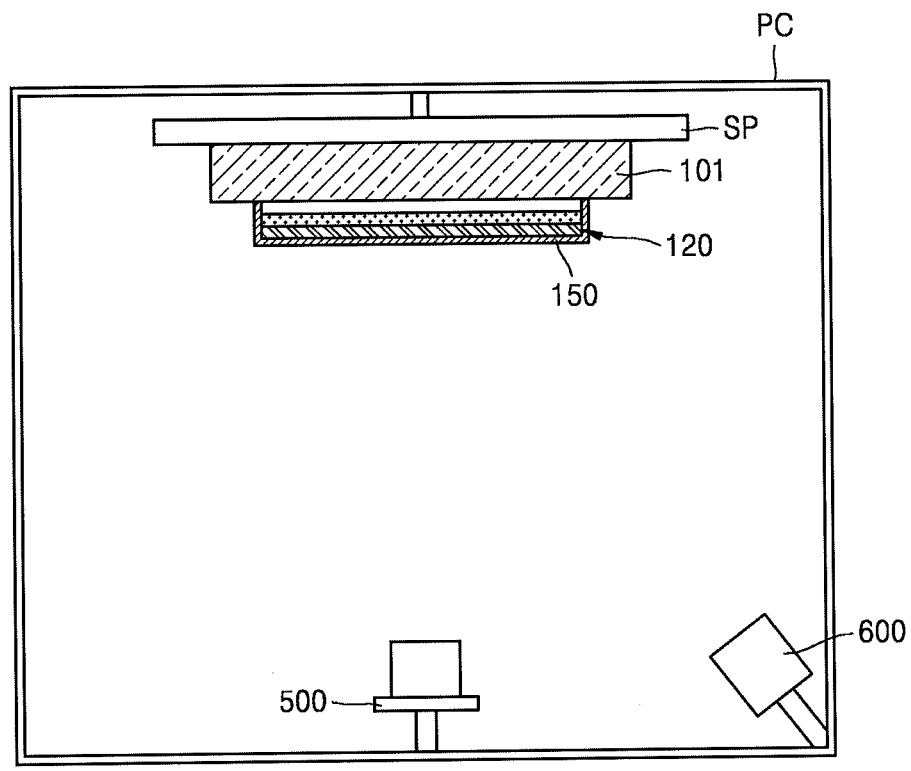
Figure 2D:
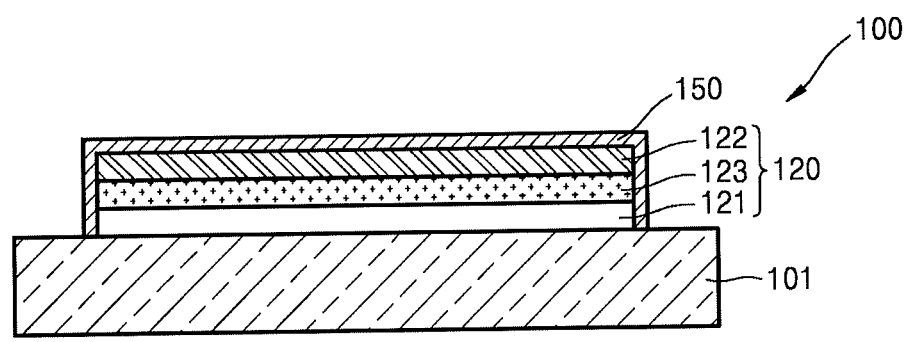

Through the above-described processes, the thin-film encapsulation layer 150 may be formed on the display device 120, as shown in FIG. 2C. Then, as shown in FIG. 2D, the display apparatus 100 may be completely manufactured.

In an implementation, the thin-film encapsulation layer 150 may be formed first and then a healing process may be further performed at a higher temperature than the viscosity transition temperature of the LVT inorganic materials but less than the denaturation temperature of the intermediate layer 123 of the display device 120. Any defects that may exist in the thin-film encapsulation layer 150 may be corrected by performing the healing process.

When the thin-film encapsulation layer 150 is formed by the method of manufacturing the display apparatus 100 according to the present embodiment, the energy beams EB may help increase the speed of providing the source materials SM during the process of providing the source materials SM as described above. Through the process, the source materials SM may be effectively scattered or distributed on the display device 120. Thus, a speed of forming the thin-film encapsulation layer 150 may be advantageously increased. In addition, when the thin-film encapsulation layer 150 is formed, any defects that may be caused by the scattered source materials SM may be easily corrected.

There may be various types of defects. For example, the defects may include impurities that are inevitably generated before or while the thin-film encapsulation layer 150 is formed, e.g., fine particles from the outside (e.g., dusts, specks, etc. from an external environment), residues that remain after the display device 120 is formed (e.g., fine particles, etc. including materials for forming the second electrode 122 which remain after the second electrode 122 is formed), or the like. Also, the defects may be the result of particles including the LVT inorganic materials that are the source materials SM.

The energy beams EB may help increase the speed of providing the source materials SM during the process of providing the source materials SM, and the aforementioned defects may be removed or corrected.

As a result, the display apparatus 100 having the thin-film encapsulation layer 150 with improved durability, which may easily help prevent moisture, impurities, or oxygen from penetrating into the display apparatus 100, may be easily implemented.

FIGS. 3A through 3E illustrate diagrams of stages in a method of manufacturing the display apparatus 100, according to another embodiment. FIGS. 3A through 3E sequentially show the method of manufacturing the display apparatus 100 of FIG. 1. However, the method of manufacturing a display apparatus may be applied to various types of display apparatuses besides the display apparatus 100 of FIG. 1.

For convenience of explanation, a difference between the present embodiment and the previous embodiment will be described.

Figure 3A:
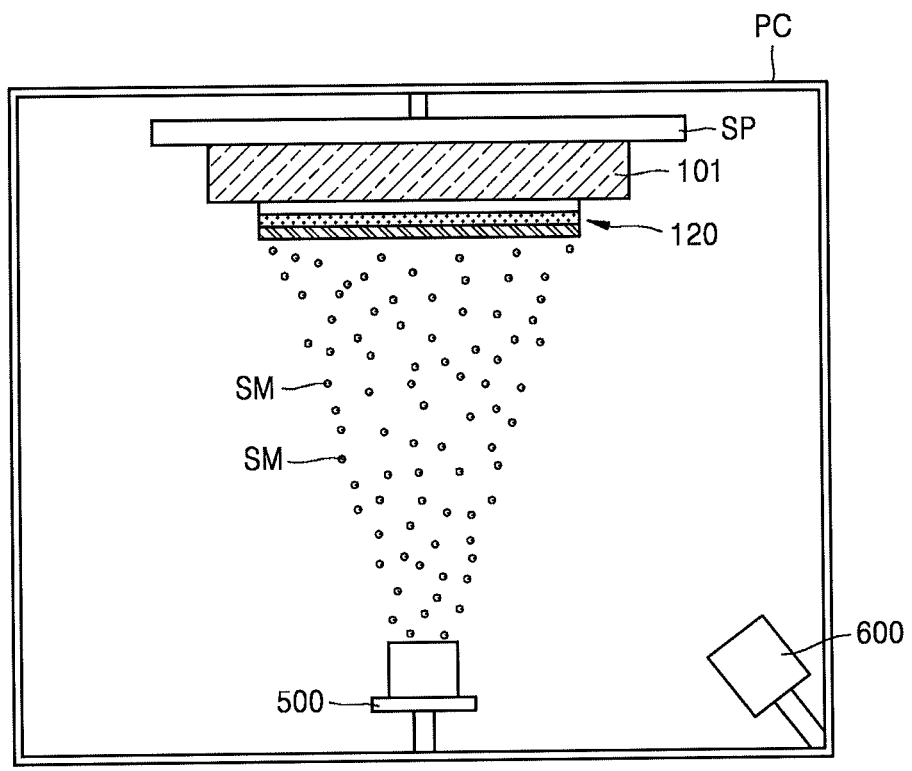
FIGS. 3A through 3E illustrate diagrams of stages in a method of manufacturing a display apparatus, according to another embodiment.

Referring to FIG. 3A, a structure in which the display device 120 is formed on the substrate 101 may be prepared, and then the structure may be arranged in the PC. The display device 120 may have various forms. When the display device 120 includes an organic light-emitting device, the display device 120 may include the first electrode 121, the second electrode 122, and the intermediate layer 123.

In this case, a process of forming the thin-film encapsulation layer 150 may be performed while the substrate 101 is arranged on the supporter SP.

The source material-providing unit 500 and the energy beam irradiating unit 600 may be arranged in the PC. The source material-providing unit 500 and the energy beam irradiating unit 600 may be arranged to face the display device 120. The source material-providing unit 500 may provide one or more source materials SM to the display device 120.

Types of the source materials SM may vary, and the source materials SM may include diverse suitable materials for forming the thin-film encapsulation layer 150. For example, as described above, the source materials SM may include at least one inorganic layer including LVT inorganic materials. A method of providing the source materials SM may be the same as various examples described in the previous embodiment.

Figure 3B:
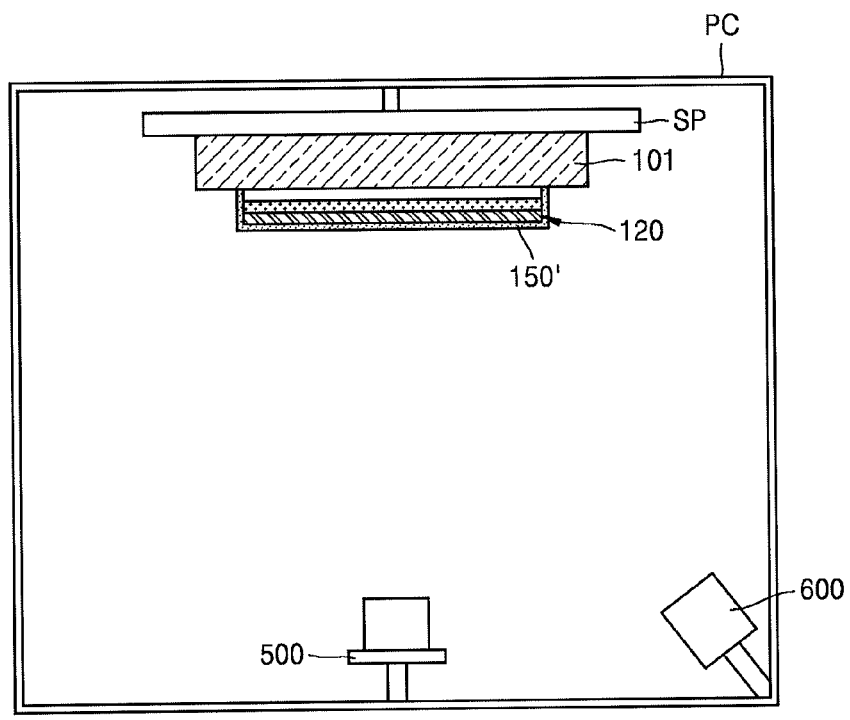

When the process of providing the source materials SM is finished, a preliminary thin-film encapsulation layer 150' may be formed, as shown in FIG. 3B.

Figure 3C:
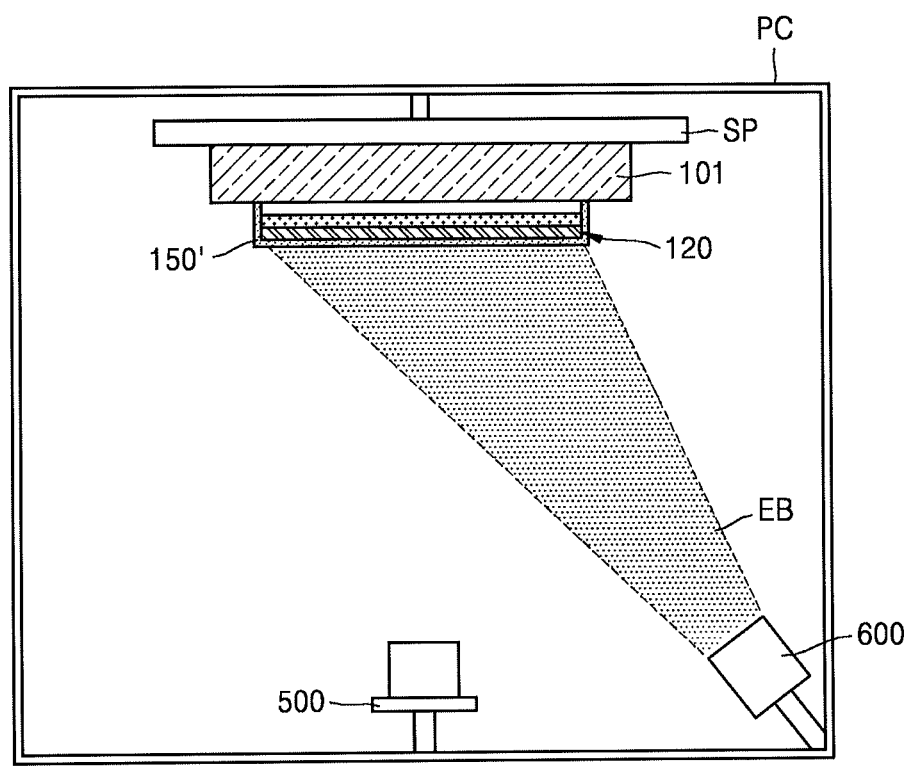

Referring to FIG. 3C, one or more energy beams EB may be irradiated on the preliminary thin-film encapsulation layer 150' by the energy beam irradiating unit 600. The energy beams EB may be irradiated in a direction toward the substrate 101, e.g., a direction toward the display device 120. For example, the energy beam irradiating unit 600 may irradiate the energy beams EB after the source materials SM have been provided in a direction toward the display device 120.

The energy beam irradiating unit 600 may irradiate energy beams EB that are in different forms. The irradiation of the energy beams EB that are in different forms is already described above, and thus, detailed descriptions thereof may not be repeated.

Figure 3D:
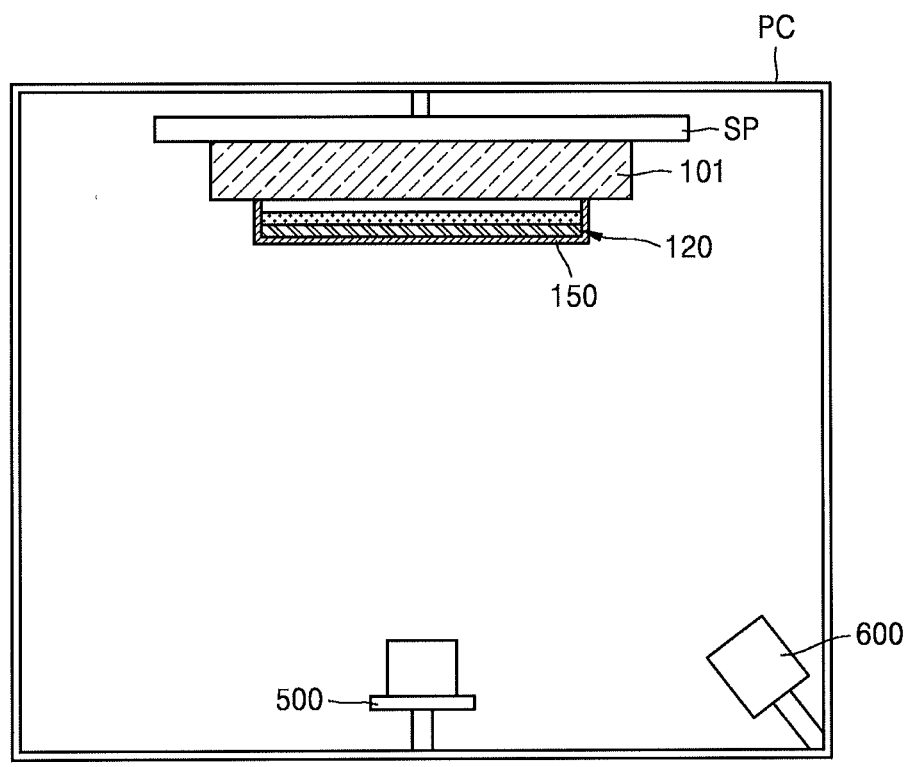
Figure 3E:
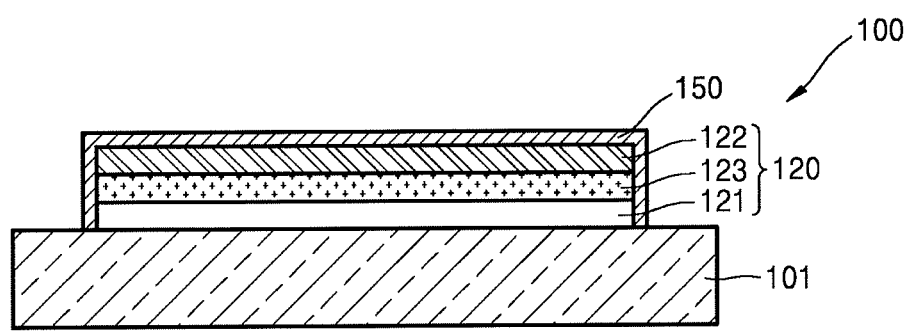

Through the above-described process, the thin-film encapsulation layer 150 may be formed on the display device 120, as shown in FIG. 3D. The display apparatus 100 may be completely manufactured as shown in FIG. 3E.

In an implementation, the thin-film encapsulation layer 150 (e.g., the preliminary thin-film encapsulation layer 150') may be formed first, and then a healing process may be further performed at a higher temperature than the viscosity transition temperature of the LVT inorganic materials but less than the denaturation temperature of the intermediate layer 123 of the display device 120 (e.g., to form the thin-film encapsulation layer 150). Any defects that may exist in the thin-film encapsulation layer 150 (e.g., the preliminary thin-film encapsulation layer 150') may be corrected by performing the healing process.

When the thin-film encapsulation layer 150 is formed by the method of manufacturing the display apparatus 100 according to the present embodiment, the process of providing the source materials SM may be performed to form the preliminary thin-film encapsulation layer 150'. Then, the energy beams EB may be irradiated on the preliminary thin-film encapsulation layer 150'. The source materials SM for forming the preliminary thin-film encapsulation layer 150' through the above process may be effectively scattered or distributed on the display device 120. Accordingly, the speed of forming the thin-film encapsulation layer 150 may be increased. In addition, when the thin-film encapsulation layer 150 is formed, defects that may be caused by the source materials SM that are scattered may be easily corrected.

As a result, the display apparatus 100 having the thin-film encapsulation layer 150 with improved durability, which may help prevent moisture, impurities, or oxygen from penetrating into the display apparatus 100, may be easily implemented.

Figure 4:
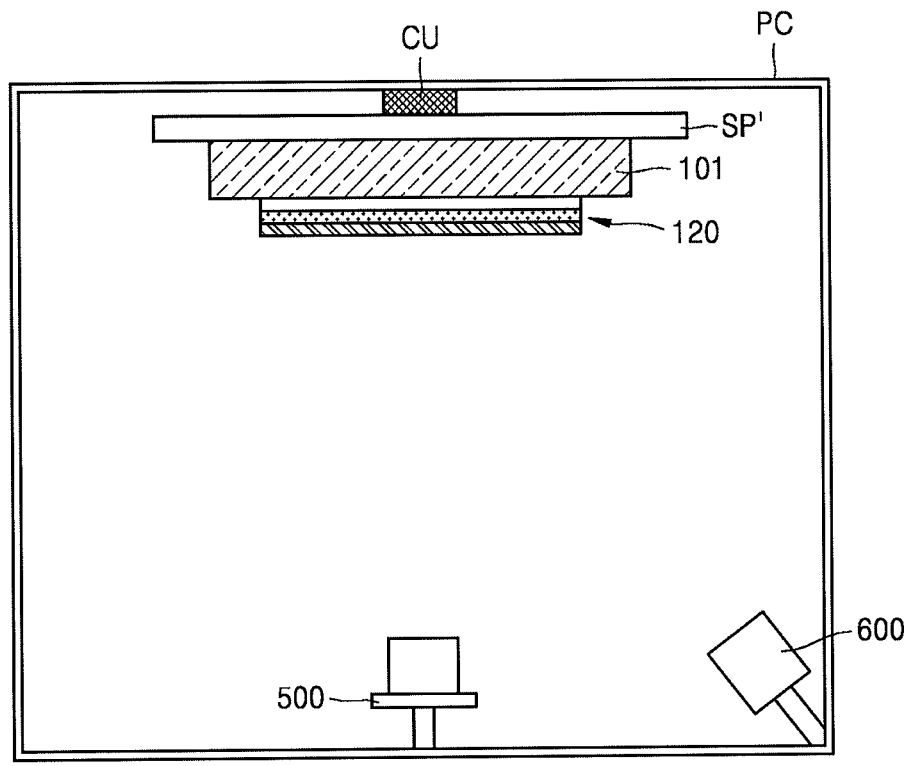
FIG. 4 illustrates a diagram of a stage in a method of manufacturing a display apparatus, according to another embodiment.

FIG. 4 illustrates a diagram of a stage in a method of manufacturing the display apparatus 100, according to another embodiment. For example, FIG. 4 shows a stage in the method of manufacturing the display apparatus 100 of FIG. 1. However, the method of the present embodiment may be applied to various display apparatuses.

For convenience of explanation, a difference between the present embodiment and the previous embodiments will be described.

Referring to FIG. 4, a structure in which the display device 120 is formed on the substrate 101 may be prepared, and the structure is arranged in the PC. The display device 120 may have various forms. When the display device 120 includes an organic light-emitting device, the display device 120 may include the first electrode 121, the second electrode 122, and the intermediate layer 123.

For example, a process of forming the thin-film encapsulation layer 150 may be performed while the substrate 101 is arranged on a supporter SP'. A cooling unit CU may be further arranged or provided to cool the substrate 101. The cooling unit CU may be arranged to face the substrate 101, e.g., the cooling unit CU may be connected to the supporter SP'. In an implementation, the supporter SP' and the cooling unit CU may be integrated.

The cooling unit CU may be provided to help prevent the substrate 101 from overheating during the process of forming the thin-film encapsulation layer 150. Through the process, the denaturation of the display device 120, e.g., the intermediate layer 123, may be effectively prevented.

The remaining processes may be the same as or may be slightly modified from the embodiments described with reference to FIGS. 2A through 2D or FIGS. 3A through 3E.

Figure 5:
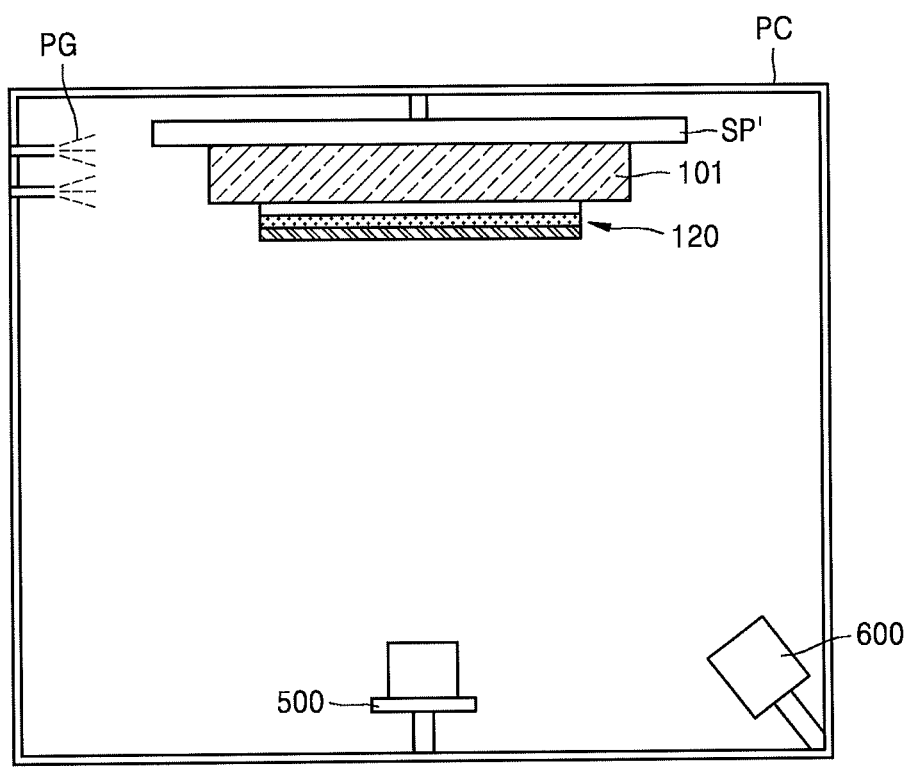
FIG. 5 illustrates a diagram of a stage in a method of manufacturing a display apparatus, according to another embodiment.

FIG. 5 illustrates a diagram of a stage in a method of manufacturing the display apparatus 100, according to another embodiment. For example, FIG. 5 shows the method of manufacturing the display apparatus 100 of FIG. 1. However, the method of manufacturing a display apparatus may be applied to various types of display apparatuses besides the display apparatus 100 of FIG. 1.

For convenience of explanation, a difference between the present embodiment and the previous embodiment will be described.

Referring to FIG. 5, a structure in which the display device 120 is formed on the substrate 101 may be prepared, and the structure is arranged in the PC. The display device 120 may have various forms. When the display device 120 includes an organic light-emitting device, the display device 120 may include the first electrode 121, the second electrode 122, and the intermediate layer 123.

For example, a process of forming the thin-film encapsulation layer 150 may be performed while the substrate 101 is arranged on the supporter SP'. While the thin-film encapsulation layer 150 is being formed on the substrate 101, a peripheral gas providing unit (PG) may make peripheral gases flow around the substrate 101.

The peripheral gases may include, e.g., oxygen, nitrogen, or an oxynitride gas. For example, the peripheral gas may include oxygen gas ($O_2$), nitrogen gas ($N_2$), and/or an oxynitride-containing gas. The peripheral gases may be provided during the process of forming the thin-film encapsulation layer 150, e.g., while the thin-film encapsulation layer 150 is formed by providing the source materials SM from the source material-providing unit 500 to the display device 120. Thus, the reactivity of the LVT inorganic materials included in the source materials SM may be improved. For example, an oxidation reaction or nitrification reaction may be improved. Through the reaction, the speed of forming the thin-film encapsulation layer 150 may be increased, and an encapsulation feature thereof may be improved.

The remaining processes may be the same as or may be slightly modified from the embodiments described with reference to FIGS. 2A through 2D or FIGS. 3A through 3E. in an implementation, the cooling unit CU of FIG. 4 may also be applied to the embodiment of FIG. 5.

As described above, according to the one or more of the above embodiments, a display apparatus with improved encapsulation features may be manufactured by a method of manufacturing a display apparatus.

By way of summation and review, a display device included in the display apparatus may be vulnerable to moisture, impurities, or heat from the outside, and the moisture, impurities, or heat may damage the display device or cause the malfunction of the display device.

The embodiments provide an encapsulation structure for encapsulating the display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a display apparatus, the method comprising:
   forming a display device on a substrate; and
   forming a thin-film encapsulation layer on the display device, the thin-film encapsulation layer including at least one inorganic layer that includes a low-temperature viscosity transition (LVT) inorganic material,
   wherein forming the thin-film encapsulation layer includes irradiating an energy beam toward the thin-film encapsulation layer during formation of the thin-film encapsulation layer,
   wherein forming the thin-film encapsulation layer includes providing a source material of the thin-film encapsulation layer to the display device, and
   wherein irradiating the energy beam includes irradiating an energy beam at one or more points of time that overlap a process time for providing the source material of the thin-film encapsulation layer to the display device.

2. The method as claimed in claim 1, wherein irradiating the energy beam is simultaneously performed with the providing the source material of the thin-film encapsulation layer to the display device.

3. The method as claimed in claim 1, wherein providing the source material of the thin-film encapsulation layer to the display device includes performing a deposition process.

4. The method as claimed in claim 1, wherein providing the source material of the thin-film encapsulation layer to the display device includes performing at least one selected from the group of evaporation, electron beam deposition, laser deposition, thermal deposition, a spraying method, and a sputtering method.

5. The method as claimed in claim 1, wherein providing the source material of the thin-film encapsulation layer to the display device includes performing co-deposition using the source material of the thin-film encapsulation layer.

6. The method as claimed in claim 1, wherein providing the source material of the thin-film encapsulation layer to the display device includes providing the source material to the display device in a direction that is at an oblique angle relative to a direction to which the energy beam is irradiated to the display device.

7. The method as claimed in claim 1, wherein the energy beam includes at least one selected from the group of ion beams, electron beams, laser beams, and neutron beams.

8. The method as claimed in claim 1, wherein irradiating the energy beam includes periodically irradiating the energy beam a plurality of times.

9. The method as claimed in claim 1, wherein irradiating the energy beam includes irregularly irradiating the energy beam a plurality of times.

10. The method as claimed in claim 1, wherein irradiating the energy beam includes ionizing inert gases to provide the energy beam.

11. The method as claimed in claim 1, wherein forming the thin-film encapsulation layer includes cooling the substrate with a cooling member.

12. The method as claimed in claim 1, wherein forming the thin-film encapsulation layer includes injecting a peripheral gas around the substrate.

13. The method as claimed in claim 12, wherein the peripheral gas includes oxygen, nitrogen, or an oxynitride gas.

14. The method as claimed in claim 1, wherein a viscosity transition temperature of the LVT inorganic material is a minimum temperature at which fluidity is provided to the LVT inorganic material.

15. The method as claimed in claim 1, wherein the LVT inorganic material includes tin oxide.

16. The method as claimed in claim 15, wherein the LVT inorganic material further includes one or more of phosphorus oxide, boron phosphate, tin fluoride, niobium oxide, tungsten oxide, aluminum, carbon, ZnO, $B_2O_3$, and BiO.

17. The method as claimed in claim 1, wherein the LVT inorganic material includes:
    SnO;
    SnO and $P_2O_5$;
    SnO and $BPO_4$;
    SnO, $SnF_2$, and $P_2O_5$;
    SnO, $SnF_2$, $P_2O_5$, and NbO; or
    SnO, $SnF_2$, $P_2O_5$, and $WO_3$.

18. A method of manufacturing a display apparatus, the method comprising:
    forming a display device on a substrate; and
    forming a thin-film encapsulation layer on the display device, the thin-film encapsulation layer including at least one inorganic layer that includes a low-temperature viscosity transition (LVT) inorganic material,
    wherein forming the thin-film encapsulation layer includes irradiating an energy beam toward the thin-film encapsulation layer during formation of the thin-film encapsulation layer, and
    wherein the energy beam includes at least one selected from the group of ion beams, electron beams, and neutron beams.

19. The method as claimed in claim 18, wherein:
    forming the thin-film encapsulation layer includes providing a source material of the thin-film encapsulation layer to the display device, and
    irradiating the energy beam is performed right after providing the source material of the thin-film encapsulation layer to the display device.

* * * * *